(12) United States Patent
Tsai et al.

(10) Patent No.: US 6,600,649 B1
(45) Date of Patent: Jul. 29, 2003

(54) HEAT DISSIPATING DEVICE

(76) Inventors: Mei-Nan Tsai, No. 948, Feng-Chou Rd., Shen-Kang Hsiang, Taichung Hsien (TW); Cheng-Lung Tsai, No. 948, Feng-Chou Rd., Shen-Kang Hsiang, Taichung Hsien (TW)

( * ) Notice: Subject to any disclaimer, the term of this patent is extended or adjusted under 35 U.S.C. 154(b) by 0 days.

(21) Appl. No.: 10/155,142

(22) Filed: May 24, 2002

(51) Int. Cl.$^7$ ................................................. H05K 7/20
(52) U.S. Cl. .................. 361/697; 361/699; 257/714; 174/15.1; 174/16.1; 174/16.3; 165/80.3; 165/80.4; 165/104.33
(58) Field of Search .................. 361/689, 697–701; 257/714, 715; 165/80.2, 80.4; 174/15.1; 62/259.2

(56) References Cited

U.S. PATENT DOCUMENTS

| | | | |
|---|---|---|---|
| 5,269,146 A | * 12/1993 | Kerner | 62/3.6 |
| 5,731,954 A | * 3/1998 | Cheon | 361/699 |
| 6,019,165 A | * 2/2000 | Batchelder | 165/80.3 |
| 6,166,907 A | * 12/2000 | Chien | 361/699 |
| 6,208,512 B1 | * 3/2001 | Goldowsky et al. | 361/699 |
| 6,263,957 B1 | * 7/2001 | Chen et al. | 165/80.4 |
| 6,324,058 B1 | * 11/2001 | Hsiao | 361/699 |
| 6,327,145 B1 | * 12/2001 | Lian et al. | 361/697 |
| 6,408,937 B1 | * 6/2002 | Roy | 165/104.33 |

* cited by examiner

*Primary Examiner*—Boris Chérvinsky
(74) *Attorney, Agent, or Firm*—Ladas and Parry

(57) ABSTRACT

A heat dissipating device includes a heat dissipating fin unit, a heat dissipating fan unit, a heat exchanger, and a pump. The pump draws working fluid from the heat exchanger via a delivery pipe, and supplies the working fluid back to the heat exchanger via a supply pipe. The supply pipe is mounted on the heat dissipating fin unit such that the working fluid is cooled while passing through the supply pipe.

4 Claims, 4 Drawing Sheets

HEAT DISSIPATING DEVICE

BACKGROUND OF THE INVENTION

1. Field of the Invention

This invention relates to a heat dissipating device, more particularly to a heat dissipating device which can ensure circulation of a working fluid to thereby increase the efficiency of the heat dissipating device.

2. Description of the Related Art

Referring to FIG. 1, a conventional heat dissipating device 10 for use in computer systems is shown to include a cooling device 11 which is adapted to be mounted on a heat generating component, a heat dissipating fan 12, and a heat dissipating fin 13. The cooling device 11 contains a working fluid and has a delivery pipe 111 for delivering the working fluid to the fin 13. The heat dissipating fan 12 has a top side formed with an air inlet 121, and a lateral side formed with an air outlet 122. The fin 13 is disposed adjacent to the air outlet 122 and is formed with a channel 131 for extension of the delivery pipe 111. Therefore, when the working fluid in the cooling device 11 absorbs heat from the heat generating component, the working fluid is cooled by simply delivering the working fluid through the delivery pipe 11 which is connected to the heat dissipating fin 13. At the same time, the heat dissipating fan 12 continuously blows air through the air outlet 122 to the heat dissipating fin 13 in order to assist in the cooling of the working fluid. However, the conventional heat dissipating device 10 has several drawbacks. First of all, since the cooling device 11 is not associated with any circulation device, the movement of the working fluid is very slow. As such, the temperature reduction of the working fluid is limited to where the delivery pipe 111 is in contact with the heat dissipating fin 13. Therefore, it is usually quite difficult to reduce the temperature to the desired range which dramatically decreases the efficiency of the heat dissipating device 10. Secondly, since only a small section of the delivery pipe 111 is in contact with the heat dissipating fin 13, the effect of heat exchanging can only occur around the peripheral surfaces of the section of the delivery pipe 111 which is in contact with the heat dissipating fin 13. Since the contacting surface is rather small, the heat dissipation is obviously not effective.

SUMMARY OF THE INVENTION

Therefore, the object of the present invention is to provide a heat dissipating device which allows the working fluid to circulate and which prolongs the time for heat exchanging and increases the surface area for heat dissipation so as to increase the efficiency of the heat dissipating device.

According to this invention, a heat dissipating device comprises a heat dissipating fin unit made of a heat-conductive material, and a heat dissipating fan unit mounted on the fin unit and operable so as to generate cooling air for cooling the fin unit. The heat dissipating device further comprises a heat exchanger including a hollow contact body that is made of a heat-conductive material, that is disposed adjacent to the fin unit, and that contains an amount of working fluid therein. The contact body is adapted to be disposed in contact with a heat generating component. The heat exchanger further includes a delivery pipe that is connected to the contact body to permit exit of the working fluid from the contact body, and a supply pipe that is connected to the contact body to permit entry of the working fluid into the contact body. The supply pipe is mounted to the heat dissipating fin unit to permit cooling of the working fluid in the supply pipe. A pump is connected to the delivery pipe and the supply pipe, and is operable so as to draw the working fluid from the contact body via the delivery pipe and to supply the working fluid into the contact body via the supply pipe. The working fluid is cooled by the fin unit while passing through the supply pipe.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 1:
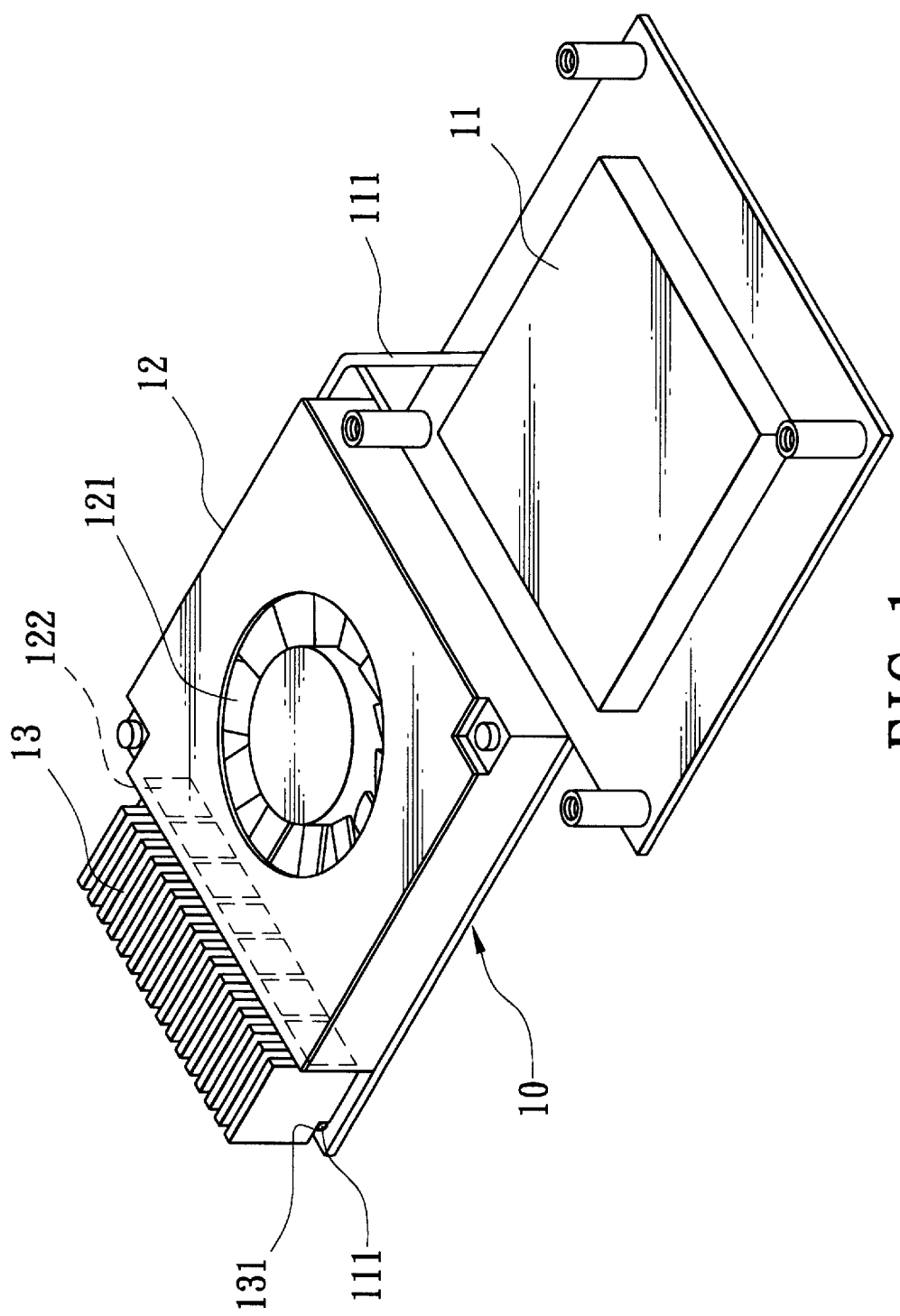
FIG. 1 illustrates a conventional heat dissipating device.
Figure 2:
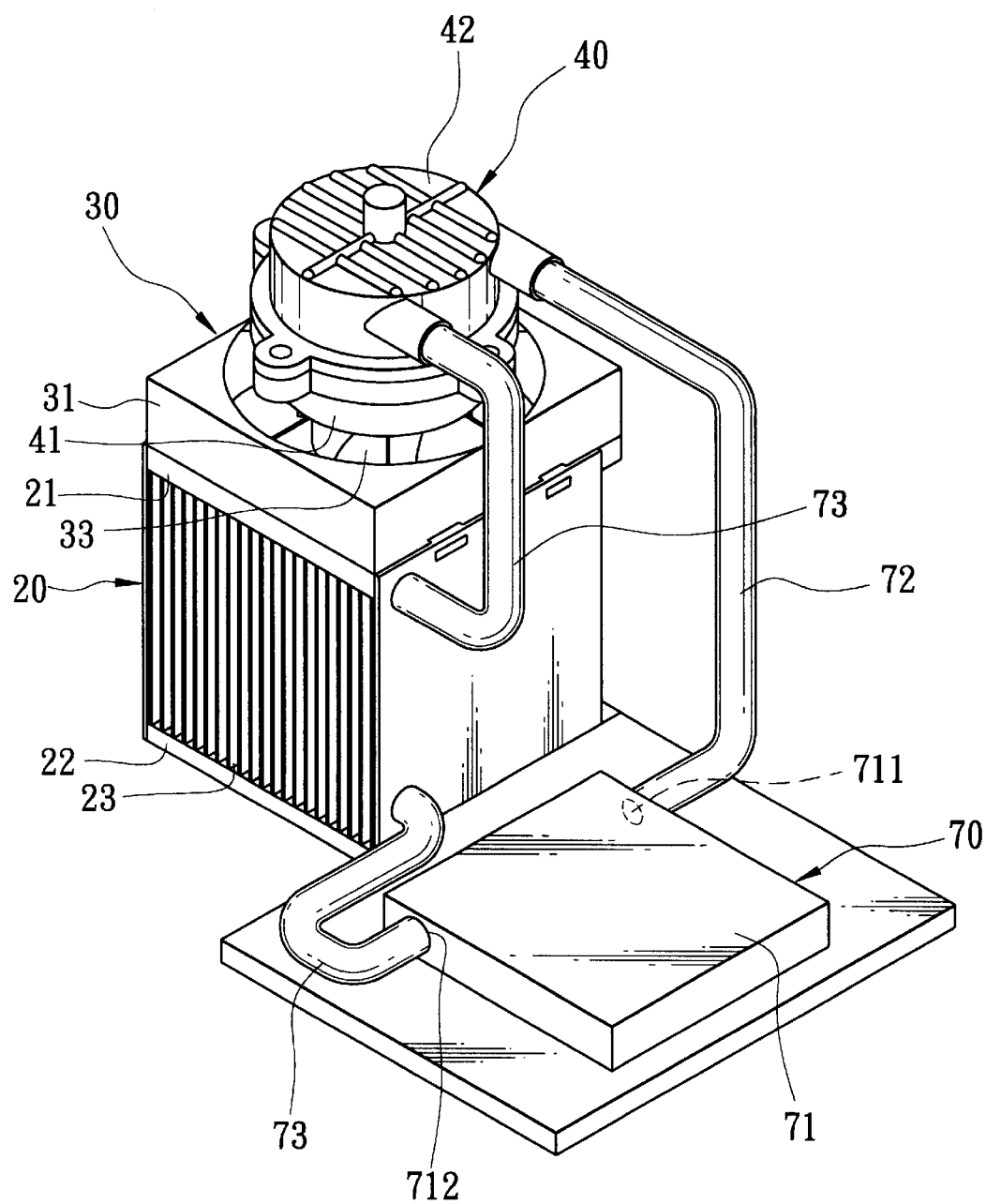
FIG. 2 illustrates the preferred embodiment of a heat dissipating device according to the present invention.
Figure 3:
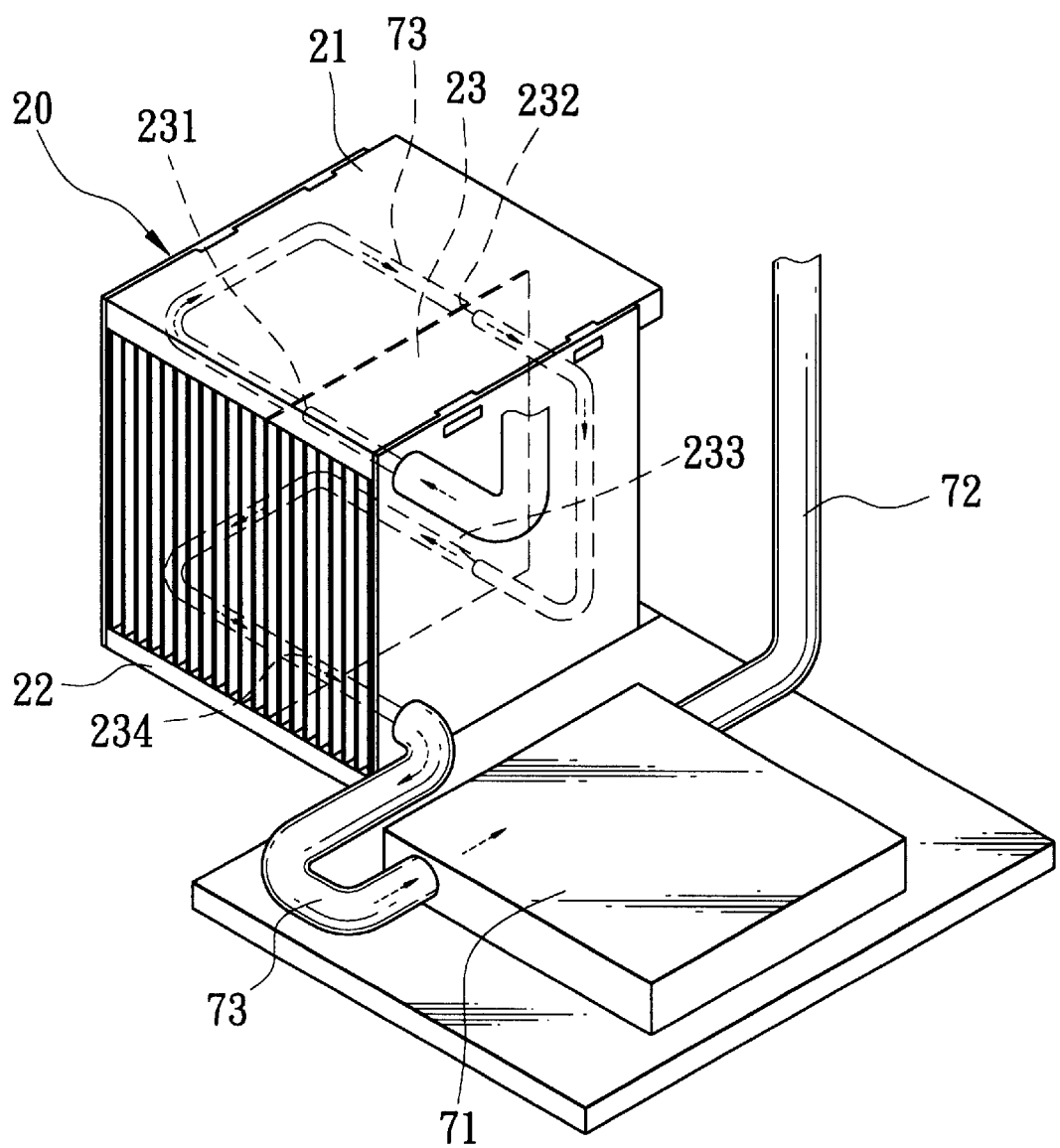
FIG. 3 illustrates the preferred path for the supply pipe of the heat dissipating device of the present invention.
Figure 4:
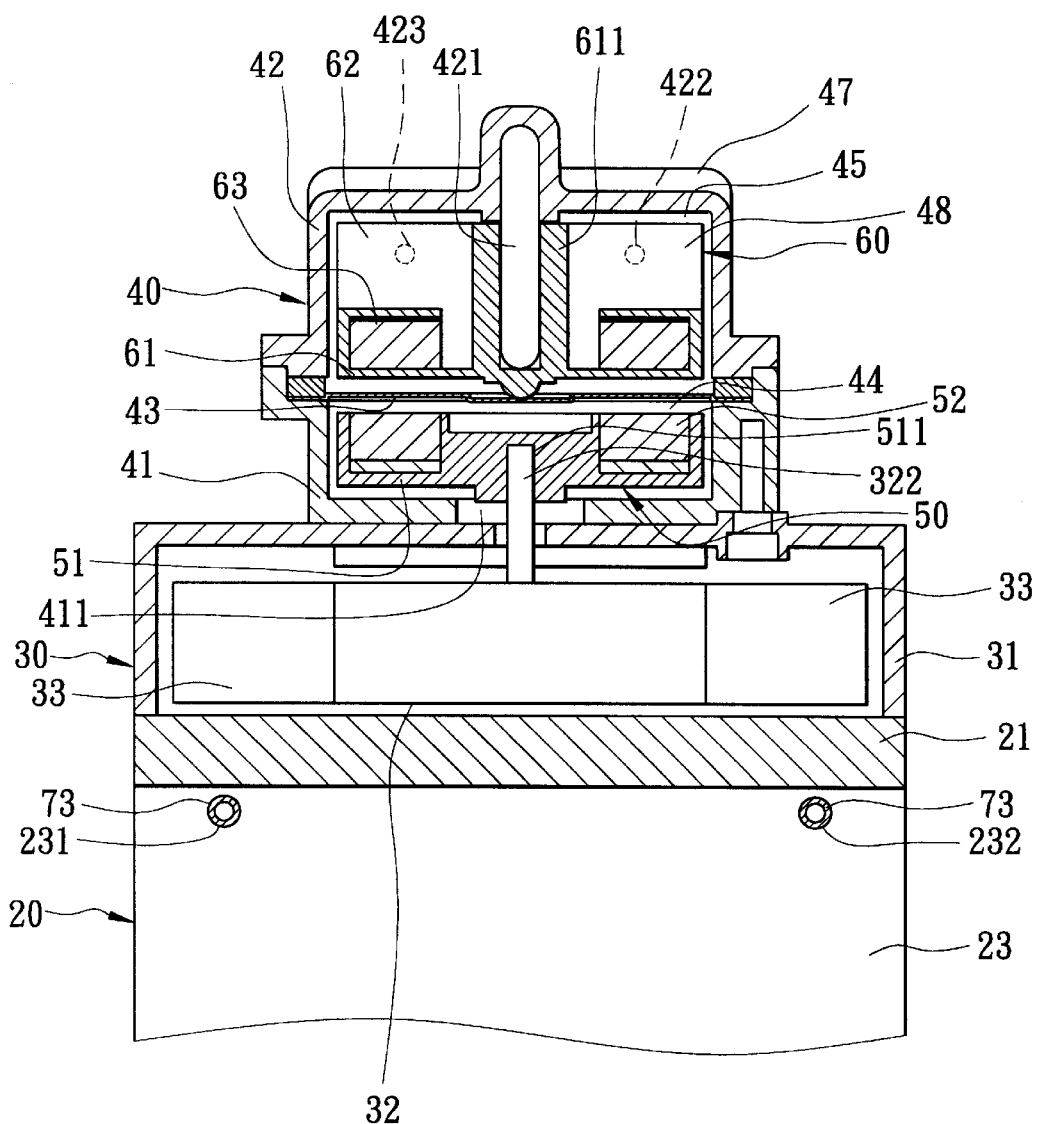
FIG. 4 is a fragmentary sectional view of the preferred embodiment of the present invention.

Referring to FIGS. 2 to 4, the preferred embodiment of a heat dissipating device according to the present invention is shown to comprise a heat dissipating fin unit 20, a heat dissipating fan unit 30, a heat exchanger 70, and a pump 40.

The heat dissipating fin unit 20 is made of a heat-conductive material, and has upper and lower walls 21, 22, the upper wall 21 being disposed above the lower wall 22, and a plurality of parallel fin plates 23 interconnecting the upper and lower walls 21, 22. Each of the fin plates 23 is formed with a first upper through hole 231 and a second upper through hole 232 spaced apart from the first upper through hole 231 along the edge of the upper wall 21. Each of the fin plates 23 is further formed with a first lower through hole 233 and a second lower through hole 234 spaced apart from the first lower through hole 233 along the edge of the lower wall 22.

The heat dissipating fan unit 30 includes a fan housing 31 mounted on top of the fin unit 20, and is operable so as to generate cooling air for cooling the fin unit 20. The fan unit 30 further includes a fan motor 32 mounted in the fan housing 31 and a plurality of fan blades 33 driven by the fan motor 32. The fan motor 32 has a rotating shaft 322 extending away from the fin unit 20 through the fan housing 31.

The heat exchanger 70 includes a hollow contact body 71 that is made of a heat-conductive material, that is disposed adjacent to the fin unit 20, and that contains an amount of working fluid therein. The hollow contact body 71 is adapted to be mounted on a heat generating component. The heat exchanger 70 further includes a delivery pipe 72 that is connected to the contact body 71 at delivery hole 711 to permit exit of the working fluid from the contact body 71, and a supply pipe 73 that is connected to the contact body 71 at supply hole 712 to permit entry of the working fluid into the contact body 71. The supply pipe 73 is mounted to the heat dissipating fin unit 20 to permit cooling of the working fluid in the supply pipe 73.

In this embodiment, the supply pipe 73 serpentines through each of the fin plates 23 by entering through the first upper through hole 231, the second upper through hole 232, and then through the first lower through hole 233, and the second lower through hole 234. This serpentine configuration not only prolongs the time that the working fluid is cooled by the heat dissipating fin unit 20, but also increases the contact surface between the supply pipe 73 and the fin unit 20 which, consequently, increases the efficiency of heat dissipation.

The pump 40 is coupled to and is driven by the fan unit 30. The pump 40 is mounted on top of the fan unit 30, and includes a housing 47 confining an interior space 48 and a partition member 43 made of a magnetic material and disposed horizontally in the housing 47 to divide the interior space 48 into a first chamber 45 and a second chamber 44, wherein the first chamber 45 is in fluid communication with the delivery pipe 72 and the supply pipe 73. Preferably, the first chamber 45 is on top of the second chamber 44. The housing 47 is formed from an upper cover 42 which confines the first chamber 45, and a lower base 41 which confines the second chamber 44. The lower base 41 has a through hole 411 to permit extension of the rotating shaft 322 of the fan unit 30 into the second chamber 44. The upper cover 42 has a positioning shaft 421 extending into the first chamber 45, and an inlet 423 and an outlet 422 for the working fluid to enter into and to exit from the first chamber 45, respectively. Thus, the delivery pipe 72 is connected between the delivery hole 711 and the inlet 423, whereas the supply pipe 73 is connected between the supply hole 712 and the outlet 422.

A blade actuator 50 is mounted rotatably in the second chamber 44, and includes a rotary plate 51 and a second set of permanent magnets 52 mounted on the rotary plate 51. The rotary plate 51 has a shaft hole 511 for securing the same to the rotating shaft 322. As such, the blade actuator 50 is coupled to and is driven by the fan motor 32.

A blade member 60 includes a rotating plate 61 disposed in the first chamber 45 such that rotation of the blade member 60 in the first chamber 45 can result in drawing of the working fluid from the contact body 71 via the delivery pipe 72 and in supplying of the working fluid into the contact body 71 via the supply pipe 73. A first set of permanent magnets 63 is provided on the blade member 60 and has a magnetic polarity opposite to the second set of permanent magnets 52. The rotating plate 61 has a sleeve 611 for coupling rotatably with the positioning shaft 421 of the upper cover 42, and a plurality of blades 62.

Referring to FIG. 4, while the fan motor 32 drives the fan blades 33, the rotating shaft 322 further drives the rotary plate 51 of the blade actuator 50 to rotate in the second chamber 44. At the same time, due to the magnetic force formed between the first and second sets of permanent magnets 63, 52, the second set of permanent magnets 52 mounted on the blade actuator 50 drags the first set of permanent magnets 63, thereby causing the blade member 60 to rotate about the positioning shaft 421, which results in the drawing and the supplying actions of the working fluid.

Therefore, after the working fluid absorbs the heat from a heat generating component, the blade member 60 draws the working fluid into the first chamber 45 via the delivery pipe 72 and supplies the working fluid to the supply pipe 73. The supply pipe 73 has a serpentine configuration which allows prolonged heat exchanging between the working fluid and the fin unit 20. At the same time, the fan unit 30 continuously blows air toward the fin unit 20 in order to assist the heat dissipation of the fin unit 20. As a consequence, the efficiency of the fin unit 20 is increased.

In summary, the heat dissipating device according to the present invention achieves the following advantages. First, the present invention ensures circulation of the working fluid through the utilization of the drawing and supplying motions of the pump 40 via the delivery pipe 72 and the supply pipe 73. Secondly, the supply pipe 73 extends through each of the fin plates 23 of the fin unit 20 in a serpentine configuration, which prolongs the time for heat exchanging between the working fluid and the fin unit 20 and which increases the contact surface for heat exchanging between the fin unit 20 and the supply pipe 73. As a result, the efficiency of the heat dissipating device according to the present invention is greatly increased.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

We claim:

1. A heat dissipating device comprising:

a heat dissipating fin unit made of a heat-conductive material;

a heat dissipating fan unit mounted on said fin unit and operable so as to generate cooling air for cooling said fin unit;

a heat exchanger including a hollow contact body that is made of a heat-conductive material, that is disposed adjacent to said fin unit, and that contains an amount of working fluid therein, said contact body being adapted to be disposed in contact with a heat generating component, said heat exchanger further including a delivery pipe that is connected to said contact body to permit exit of the working fluid from said contact body, and a supply pipe that is connected to said contact body to permit entry of the working fluid into said contact body, said supply pipe being mounted to said heat dissipating fin unit to permit cooling of the working fluid in said supply pipe; and a pump connected to said delivery pipe and said supply pipe and operable so as to draw the working fluid from said contact body via said delivery pipe and to supply the working fluid into said contact body via said supply pipe; whereby, the working fluid is cooled by said fin unit while passing through said supply pipe, wherein said pump is coupled to and is driven by said fan unit, wherein said fan unit is mounted on top of said fin unit, said pump being mounted on top of said fan unit.

2. A heat dissipating device according to claim 1, wherein said magnet means includes:

a first set of permanent magnets mounted on said blade member; and a second set of permanent magnets mounted on said blade actuator and having a magnetic polarity opposite to said first set of permanents.

3. A heat dissipating device according to claim 1, wherein:

said fin unit includes a plurality of parallel fin plates that are formed with aligned pipe holes therethrough;

said supply pipe passing through said pipe holes in said fin plates and forming a serpentine configuration.

4. A heat dissipating device comprising:

a heat dissipating fin unit made of a heat-conductive material;

a heat dissipating fan unit mounted on said fin unit and operable so as to generate cooling air for cooling said fin unit;

a heat exchanger including a hollow contact body that is made of a heat-conductive material, that is disposed adjacent to said fin unit, and that contains an amount of working fluid therein, said contact body being adapted to be disposed in contact with a heat generating component, said heat exchanger further including a delivery pipe that is connected to said contact body to permit exit of the working fluid from said contact body, and a supply pipe that is connected to said contact body to permit entry of the working fluid into said contact body, said supply pipe being mounted to said heat dissipating fin unit to permit cooling of the working fluid in said supply pipe; and a pump connected to said delivery pipe and said supply pipe and operable so as to draw the working fluid from said contact body via said delivery pipe and to supply the working fluid into said contact body via said supply pipe, whereby, the working fluid is cooled by said fin unit while passing through said supply pipe, wherein said pump includes:

a housing confining an interior space;

a partition member made of a magnetic material and disposed in said housing to divide said interior space into a first chamber and a second chamber, said first chamber being in fluid communication with said delivery pipe and said a blade member mounted rotatable in said first chamber such that rotation of said blade member in said first chamber can result in drawing of the working fluid from said contact body via said delivery pipe and in supplying of the working fluid into said contact body via said supply pipe;

a blade actuator mounted rotatable in said second chamber; and magnet means provided on said blade member and said blade actuator for magnetically coupling said blade member and said blade actuator such that rotation of said blade actuator in said second chamber will drag said blade member to rotate in said first chamber, wherein:

said fan unit is mounted on top of said fin unit, and includes a fan motor;

said housing of said pump being mounted on top of said fan unit such that said second chamber is disposed between said first chamber and said fan unit;

said blade actuator being coupled to and being driven by said fan motor.

\* \* \* \* \*